US012362295B2

(12) United States Patent
Radhakrishnan

(10) Patent No.: US 12,362,295 B2
(45) Date of Patent: Jul. 15, 2025

(54) PLANAR MAGNETIC RADIAL INDUCTORS TO ENABLE VR DISAGGREGATION

(71) Applicant: Intel Corporation, Santa Clara, CA (US)

(72) Inventor: Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 982 days.

(21) Appl. No.: 17/031,821

(22) Filed: Sep. 24, 2020

(65) Prior Publication Data

US 2022/0093537 A1 Mar. 24, 2022

(51) Int. Cl.
| | |
|---|---|
| *H01F 27/24* | (2006.01) |
| *H01F 27/28* | (2006.01) |
| *H01F 27/32* | (2006.01) |
| *H01L 23/498* | (2006.01) |
| *H01L 23/64* | (2006.01) |
| *H01L 25/065* | (2023.01) |

(52) U.S. Cl.
CPC ........... *H01L 23/645* (2013.01); *H01F 27/24* (2013.01); *H01F 27/2804* (2013.01); *H01F 27/323* (2013.01); *H01L 23/49822* (2013.01); *H01L 23/49827* (2013.01); *H01L 25/0655* (2013.01); *H01F 2027/2809* (2013.01)

(58) Field of Classification Search
CPC .... H01F 27/24; H01F 27/2804; H01F 27/323; H01F 2027/2809; H01L 23/49822; H01L 23/49827; H01L 25/0655
See application file for complete search history.

(56) References Cited

U.S. PATENT DOCUMENTS

| | | | |
|---|---|---|---|
| 2014/0347825 A1 | 11/2014 | Guo et al. | |
| 2018/0366442 A1* | 12/2018 | Gu | .............. H01L 25/0657 |
| 2019/0304661 A1* | 10/2019 | Xu | .............. H01F 17/0006 |

(Continued)

FOREIGN PATENT DOCUMENTS

| | | |
|---|---|---|
| EP | 3605564 | 2/2020 |
| TW | 202002183 | 1/2020 |

(Continued)

OTHER PUBLICATIONS

International Preliminary Report on Patentability for International Patent Application No. PCT/US2021/047175, mailed Apr. 6, 2023, 6 pgs.

(Continued)

*Primary Examiner* — Mohammad M Choudhry
(74) *Attorney, Agent, or Firm* — Schwabe, Williamson & Wyatt P.C.

(57) ABSTRACT

Embodiments disclosed herein include electronic packages with embedded inductors. In an embodiment, an electronic package comprises a package substrate, where the package substrate comprises a plurality of dielectric layers. In an embodiment, the electronic package further comprises an inductor embedded in the package substrate, where the inductor comprises: a trace with a first end and a second end. In an embodiment, a magnetic material surrounds the trace between the first end and the second end. In an embodiment, a first via is connected to the first end, and a second via is connected to the second end.

11 Claims, 9 Drawing Sheets

(56) References Cited

U.S. PATENT DOCUMENTS

| | | |
|---|---|---|
| 2020/0006287 A1 | 1/2020 | Hill et al. |
| 2020/0082982 A1 | 3/2020 | Yazaki |
| 2020/0220473 A1 | 7/2020 | Ji |
| 2020/0220474 A1 | 7/2020 | Ji et al. |

FOREIGN PATENT DOCUMENTS

| | | | |
|---|---|---|---|
| WO | WO-2016202949 A1 * | 12/2016 | ......... H01F 17/0033 |
| WO | WO 2019/066994 A1 | 4/2019 | |
| WO | WO 2019-130746 | 7/2019 | |

OTHER PUBLICATIONS

International Search Report and Written Opinion for International Patent Application No. PCT/US2021/047175, mailed Dec. 14, 2020, 10 pgs.

Office Action from Netherlands Patent Application No. 2029001, mailed Apr. 6, 2022, 12 pgs.

Extended European Search Report from European Patent Application No. 21873152.9 mailed Aug. 23, 2024, 10 pgs.

Office Action for Taiwan Patent Application No. 110130300, mailed Apr. 16, 2025, 10 pgs.

* cited by examiner

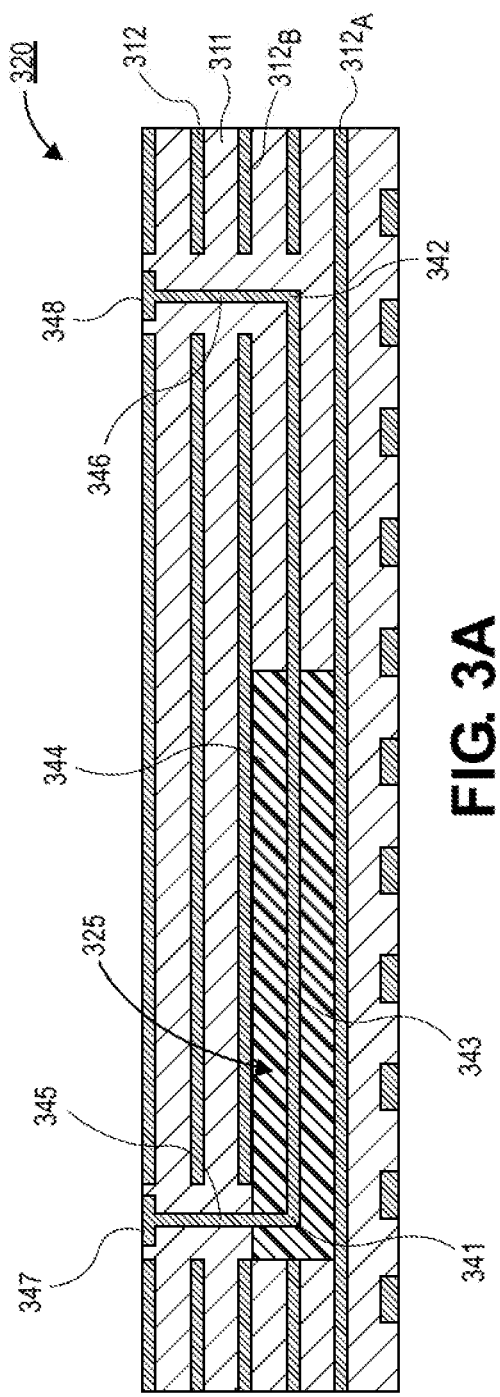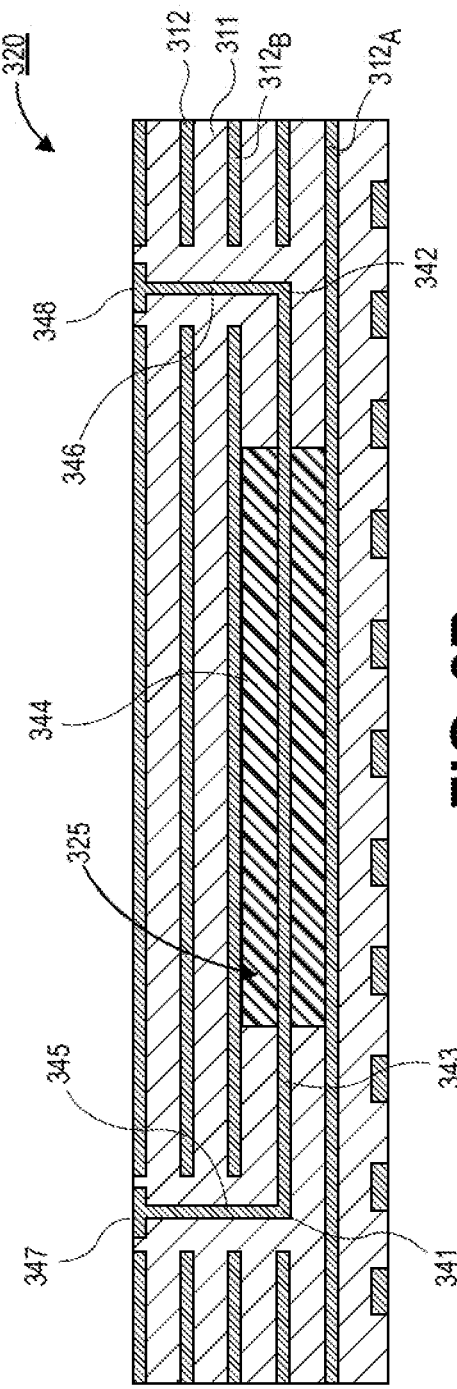

PLANAR MAGNETIC RADIAL INDUCTORS TO ENABLE VR DISAGGREGATION

TECHNICAL FIELD

Embodiments of the present disclosure relate to semiconductor devices, and more particularly to planar magnetic radial inductors for enabling voltage regulation (VR) disaggregation.

BACKGROUND

Currently, voltage regulator (VR) circuitry is provided on the processing core. Co-locating the processing core with the VR circuitry provides the advantage of having the power regulation circuitry proximate to the load it is servicing. However, co-locating the VR circuitry and the load on a single processing core is not without issue. For example, the processing cores are manufactured at a processing node that is more advanced than is necessary for the fabrication of the VR circuitry. Designing the VR circuitry on the latest process nodes adds cost and complexity to the processing core. Additionally, the VR circuitry itself does not gain any significant advantage from being fabricated on the advanced processing nodes. Furthermore, adding the complex analog circuitry to the processing core makes it difficult to port the processing core from one process to another.

In order to improve manufacturing efficiencies, it has been proposed to disaggregate the voltage regulation (VR) circuitry from the processing cores. However, moving the VR circuitry off of the processing core results in a decrease in the performance of the VR circuitry. This is primarily because it is difficult to provide a low impedance path from the VR to the load on the processing core.

BRIEF DESCRIPTION OF THE DRAWINGS

FIG. 3A is a cross-sectional illustration of a package substrate with an embedded planar inductor with the magnetic material extending partially along a length of a trace between a first end and a second end of the planar inductor, in accordance with an embodiment.

FIG. 3B is a cross-sectional illustration of a package substrate with an embedded planar inductor with the magnetic material surrounding a portion of a trace between a first end and a second end of the planar inductor, in accordance with an embodiment.

EMBODIMENTS OF THE PRESENT DISCLOSURE

Described herein are planar magnetic radial inductors for enabling voltage regulation (VR) disaggregation, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
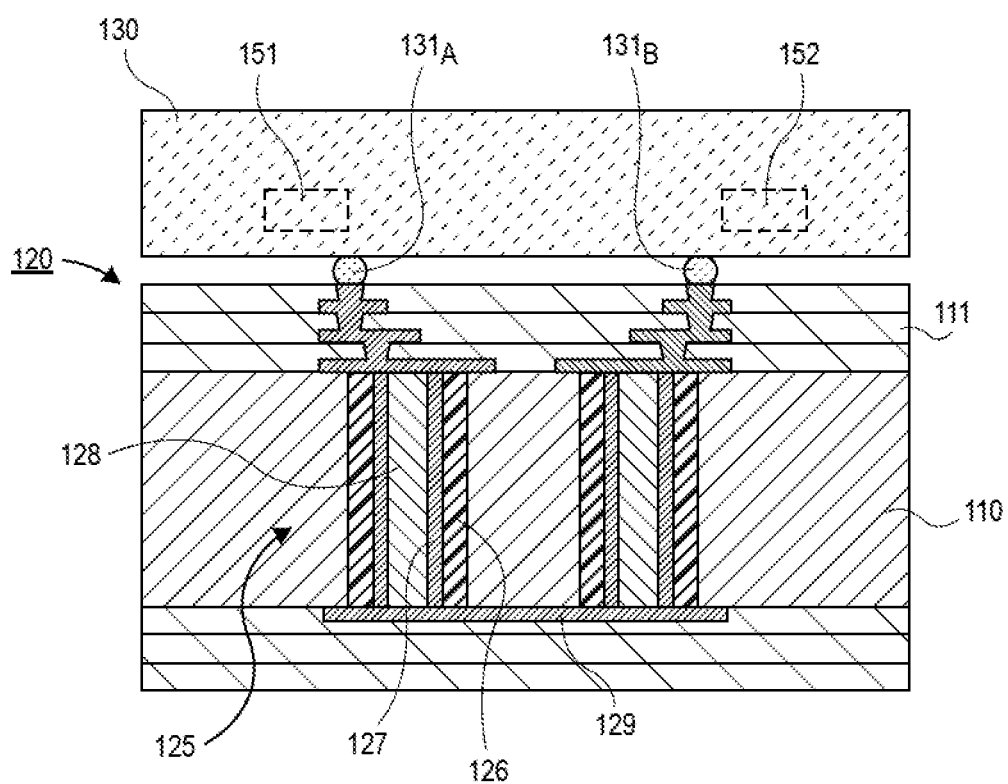
FIG. 1 is a cross-sectional illustration of a die with VR circuitry co-located on the processing core that includes a coaxial metal inductor loop (coax MIL) inductor that is coupled between the VR circuitry and the load on the processing core, in accordance with an embodiment.

To provide context, electronic systems currently available include the VR circuitry on the same die as the load. For example, in FIG. 1 the die 130 includes the VR circuitry 151 and the load 152. The VR circuitry 151 is coupled to the load 152 through an inductor 125 in the package substrate 120. Particularly, the package substrate 120 may include a core 110 with insulating layers 111 above and below the core. The inductor 125 is embedded in the core 110. In the particular case illustrated in FIG. 1, the inductor 125 is a coaxial metal inductor loop (coax MIL) inductor. The inductor 125 includes a plated through hole 127 that is surrounded by a magnetic shell 126 and plugged with an insulating material 128. A pair of plated through holes 127 are electrically connected to each other by a trace 129. Conductive vias, pads, etc. connect the plated through holes 127 to solder balls 131A and 131B. The solder ball 131A is electrically coupled to the VR circuitry 151, and the solder ball 131E is electrically coupled to the load 152.

Such an inductor architecture provides good power performance, but due to the compact nature of the coax MIL inductor, the load 152 needs to be proximately located to the VR circuitry 151. Spacing the load 152 further from the VR circuitry 151 is possible, but comes at the cost of increased impedance. This diminishes the performance of the VR solution.

Furthermore, as noted above, there is a drive towards disaggregation of the voltage regulator (VR) circuitry from the processing core. Disaggregation has the benefit of reducing the cost of the processor core. Additionally, device requirements for analog circuits (such as the VR circuitry) are significantly different than the device requirements for the digital logic of the processor core. As such, moving the VR circuitry to a die that includes analog circuitry (such as an I/O die) will allow for better optimization of the VR circuitry.

Accordingly, embodiments disclosed herein include planar inductor architectures that allow for VR disaggregation from the processor cores. For example, the VR circuitry may be moved to an I/O die. The planar inductor architecture provides an inductor that can span the distance between a first die (where the VR circuitry is located) and a second die (where the load is located). By offloading the VR circuitry from the processor core, the cost of the processor core is reduced, and porting the processor core from one process to another is simplified. Additionally, the use of planar inductor architectures, such as those described herein, allow for a reduction in the cost of the package substrate. This is due to the fact that the planar inductors may be embedded in the dielectric buildup layers instead of being formed through a core, as is the case with the coax MIL inductor described above.

In an embodiment, the planar inductors comprise a trace in the buildup layers that is encapsulated by magnetic material. Unlike the coax MTh inductors, the planar inductors can have a first end under a first die and a second end under a second die. Controlling a spacing between the two ends can be used to provide a desired inductance to the planar inductor. Additionally, controlling how much of the trace that is surrounded by the magnetic material can also be used to fine tune the inductance of the planar inductor.

Figure 2A:
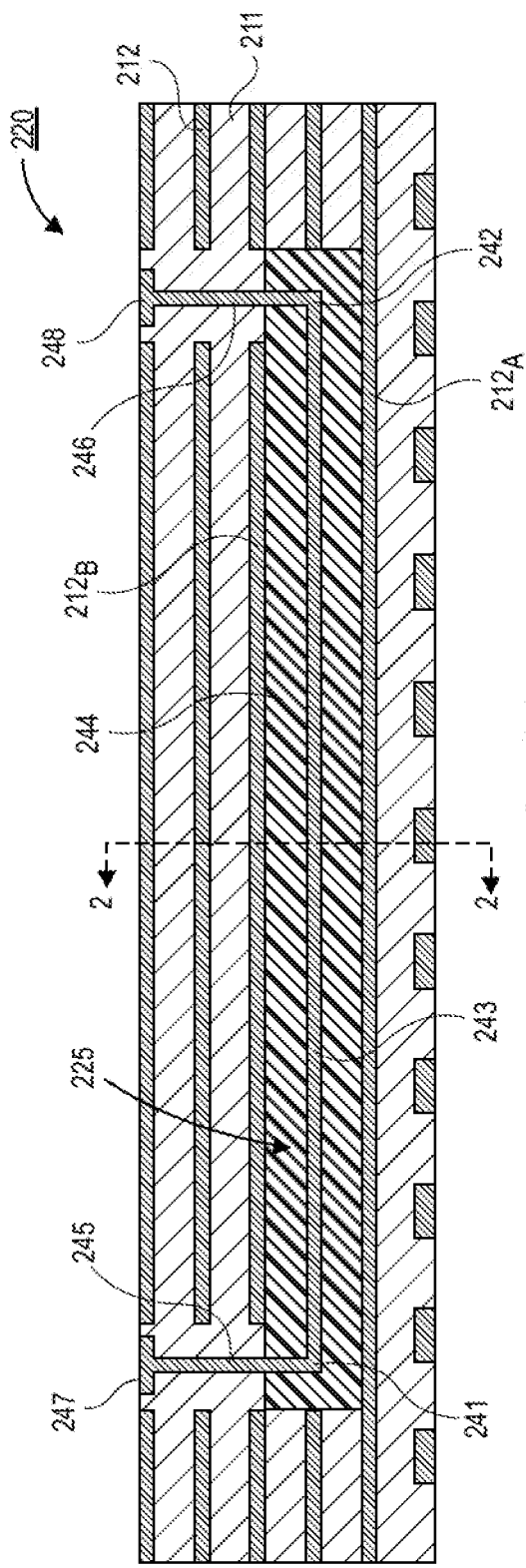
FIG. 2A is a cross-sectional illustration of a package substrate that comprises a planar inductor embedded in the package substrate, in accordance with an embodiment.

Referring now to FIG. 2A, a cross-sectional illustration of a package substrate 220 is shown, in accordance with an embodiment. In an embodiment, the package substrate 220 may comprise a plurality of dielectric buildup layers 211. In some embodiments, the package substrate 220 is coreless. That is, the structure of the package substrate 220 comprises laminated buildup layers without the need for a fiber reinforced core. However, it is to be appreciated that in some embodiments a core may also be included in the package substrate 220.

In an embodiment, conductive routing may be provided in the package substrate 220. For example, conductive layers 212 may be provided in and/or on individual buildup layers 211. The conductive layers 212 in FIG. 2A are shown as traces for simplicity. Those skilled in the art will recognize that the conductive layers 212 may comprise conductive planes, traces, pads, vias, etc. necessary for providing the needed routing within the package substrate 220. In an embodiment, the conductive layers 212 may comprise copper or any other suitable conductive material.

In an embodiment, a planar inductor 225 is embedded in the package substrate 220. The planar inductor 225 may comprise a trace 243. The trace 243 may be provided as part of any of the conductive layers 212. In an embodiment, the trace 243 comprises a first end 241 and a second end 242. The first end 241 may be provided below a footprint of a first die (not shown), and the second end 242 may be provided below a footprint of a second die (not shown). In an embodiment, a length of the trace 243 between the first end 241 and the second end 242 may be between approximately 1.0 mm and approximately 15 mm. In the illustrated embodiment, the trace 243 is shown as a substantially straight line. However, it is to be appreciated that the trace 243 may include turns into and/or out of the plane of FIG. 2A to provide the necessary routing between the first end 241 and the second end 242.

In an embodiment, the trace 243 may be surrounded by a magnetic material 244. The magnetic material 244 may be any suitable magnetic material that is compatible with package substrate manufacturing processes. In some embodiments, the magnetic material 244 may comprise a moldable magnetic material. For example, the magnetic material 244 may comprise an epoxy filled with magnetic filler particles, such as, but not limited to, ferrites, iron alloys, and cobalt.

In an embodiment, the magnetic material 244 may extend along the length of the trace 243 between the first end 241 and the second end 242. In the illustrated embodiment, the magnetic material 244 extends past the first end 241 and past the second end 242. The magnetic material 244 may replace portions of one or more dielectric buildup layers 211. In the illustrated embodiment, the magnetic material 244 may be in direct contact with a first conductive layer 212A below the trace 243 and a second conductive layer 212E above the trace 243. However, in other embodiments, portions of the dielectric layer 211 may be provided between the magnetic material 244 and the conductive layers 212A and 212B.

In an embodiment, the first end 241 of the trace 243 may be connected to a pad 247 on a top surface of the package substrate 220 by a via 245. Similarly, the second end 242 of the trace 243 may be connected to a pad 248 on the top surface of the package substrate 220 by a via 246. In the illustrated embodiment, the vias 245 and 246 are shown as having substantially vertical sidewalls. However, it is to be appreciated that the vias 245 and 246 may include tapered sidewalls, as is common in laser drilled vias. Additionally, while shown as a single via through multiple dielectric layers 211, it is to be appreciated that a plurality of vias and pads may be provided (e.g., a via and a pad through each dielectric layer 211) in the package substrate 220. In the illustrated embodiment, the vias 245 and 246 are directly contacting the buildup layers 211. However, in some embodiments, magnetic material 244 may also extend up towards the top surface of the package substrate 220 and surround one or both of the vias 245 and 246.

Figure 2B:
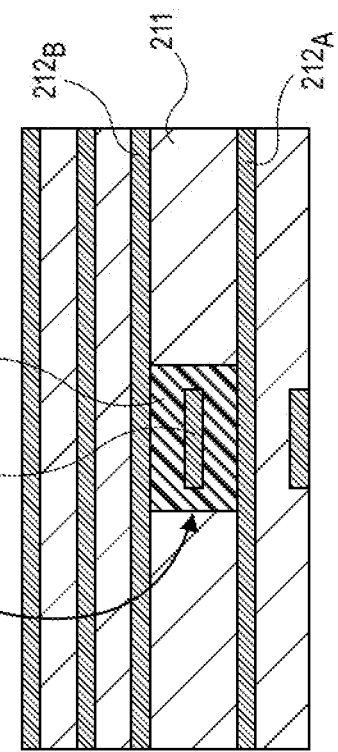
FIG. 2B is a cross-sectional illustration of the package substrate in FIG. 2A, in accordance with an embodiment.

Referring now to FIG. 2B, a cross-sectional illustration of the package substrate 220 in FIG. 2A along line 2-2 is shown, in accordance with an embodiment. As shown, the planar inductor 225 comprises a trace 243 that is entirely surrounded by the magnetic material 244. That is, the magnetic material 244 wraps around a top surface, a bottom surface, and sidewall surfaces of the trace 243. FIG. 2B also shows that the magnetic material 244 directly contacts the neighboring first conductive layer 212A and the neighboring second conductive layer 212B.

Figure 2C:
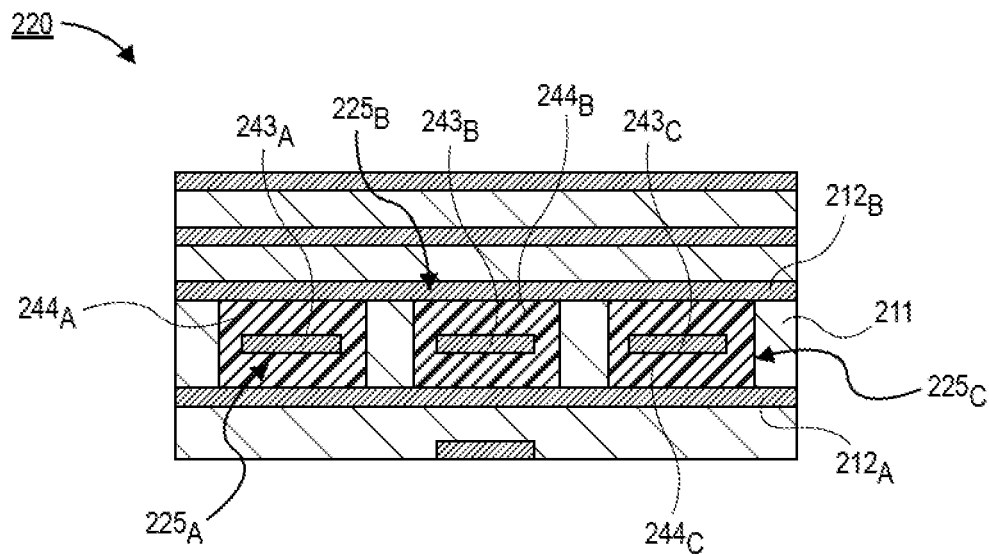
FIG. 2C is a cross-sectional illustration of a package substrate with a plurality of planar inductors embedded in the package substrate, in accordance with an embodiment.

Referring now to FIG. 2C, a cross-sectional illustration of the package substrate 220 in FIG. 2A along line 2-2 is shown, in accordance with an additional embodiment. As shown, a plurality of planar inductors $225_{A-C}$ may be provided adjacent to each other within a single dielectric buildup layer 211. In an embodiment, each of the planar inductors $225_{A-C}$ comprise a trace $243_{A-C}$ and a magnetic material $244_{A-C}$ surrounding the trace $243_{A-C}$. In an embodiment, portions of the dielectric buildup layer 211 may separate sidewalls of the magnetic materials $244_{A-C}$ from each other. That is, in some embodiments, discrete portions of the magnetic material 244$_{A-C}$ may be provided around each of the traces 243$_{A-C}$. While three planar inductors 225$_{A-C}$ are shown, it is to be appreciated that any number of planar inductors 225 may be provided adjacent to each other, in accordance with an embodiment.

Figure 2D:
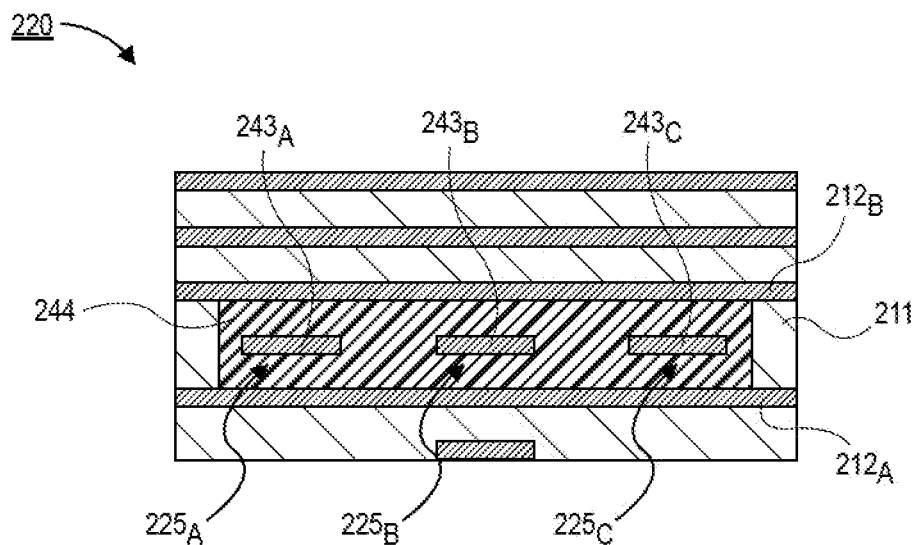
FIG. 2D is a cross-sectional illustration of a package substrate with a plurality of planar inductors surrounded by a single magnetic material, in accordance with an embodiment.

Referring now to FIG. 2D, a cross-sectional illustration of the package substrate 220 in FIG. 2A along line 2-2 is shown, in accordance with yet another additional embodiment. As shown, the plurality of planar inductors 225$_{A-C}$ share a common magnetic material 244. That is, a single magnetic material 244 wraps around each of the planar inductors 225$_{A-C}$. While three planar inductors 225$_{A-C}$ embedded within a single magnetic material 244 are shown, it is to be appreciated that any number of planar inductors 225 may be embedded within a single magnetic material 244, in accordance with an embodiment.

Referring now to FIG. 3A, a cross-sectional illustration of a package substrate 320 is shown, in accordance with an additional embodiment. In an embodiment, the package substrate 320 may be substantially similar to the package substrate 220 in FIG. 2A, with the exception of the length of the magnetic material 344.

In an embodiment, the package substrate 320 comprises a plurality of dielectric buildup layers 311 and conductive layers 312. In an embodiment, a planar inductor 325 is embedded in the package substrate 320. The planar inductor 325 may comprise a trace 343. The trace 343 may be part of a conductive layer 312. In an embodiment, the trace 343 comprises a first end 341 and a second end 342. The first end 341 is coupled to a pad 347 on a top surface of the package substrate 320 by a via 345, and the second end 342 is coupled to a pad 348 on the top surface of the package substrate 320 by a via 346.

In an embodiment, the planar inductor 325 may further comprise a magnetic material 344. The magnetic material 344 may surround a perimeter of the trace 343. In an embodiment, portions of the magnetic material 344 may directly contact conductive layer 312A below the trace 343 and conductive layer 312E above the trace 343.

In an embodiment, the magnetic material 344 does not extend along an entire length of the trace 343 between the first end 341 and the second end 342. For example, the magnetic material 344 may surround the first end 341 and extend partially along the length of the trace 343. That is, the second end 342 of the trace 343 may be surrounded and contacted by the dielectric buildup layers 311 instead of the magnetic material 344. As those skilled in the art will appreciated, controlling the portion of the trace 343 that is surrounded by the magnetic material 344 allows for the inductance of the planar inductor 325 to be tuned. For example, higher inductances are provided when more of the trace 343 is surrounded by the magnetic material 344.

Referring now to FIG. 3B, a cross-sectional illustration of a package substrate 320 is shown, in accordance with an additional embodiment. The package substrate 320 in FIG. 3B may be substantially similar to the package substrate 320 in FIG. 3A, with the exception that the magnetic material 344 does not surround either the first end 341 or the second end 342 of the trace 343. Instead, the magnetic material 344 surrounds only a central portion of the trace 343. Similar to the embodiment in FIG. 3A, the inductance of the planar inductor 325 can be tuned by controlling how much of the trace 343 is surrounded by the magnetic material 344.

Figure 4A:
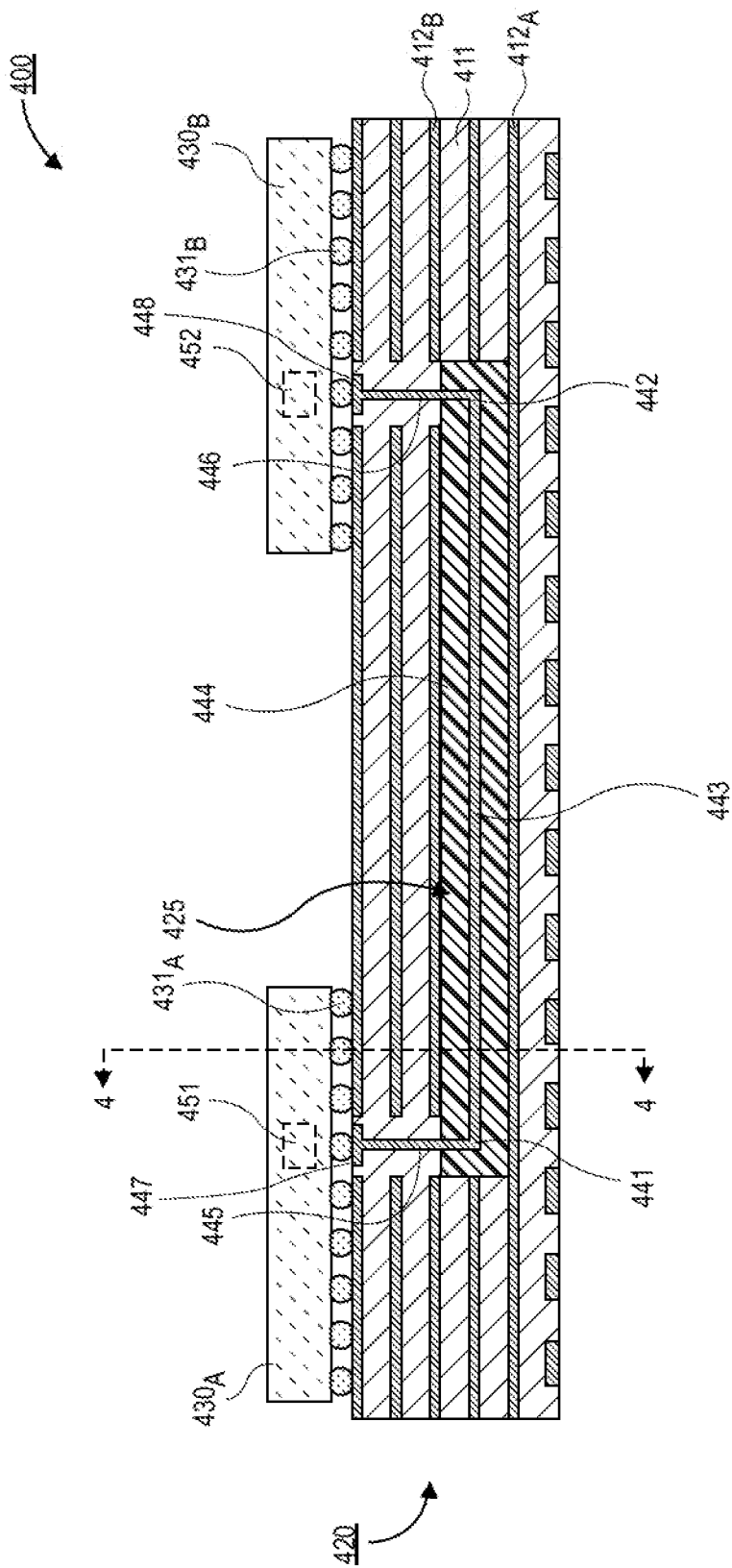
FIG. 4A is a cross-sectional illustration of an electronic system with a package substrate that comprises an embedded planar inductor that has a first end below a first die and a second end below a second die, in accordance with an embodiment.

Referring now to FIG. 4A, a cross-sectional illustration of an electronic system 400 is shown, in accordance with an embodiment. In an embodiment, the electronic system 400 comprises a package substrate 420, a first die 430A and a second die 430B. In an embodiment, the package substrate 420 may be substantially similar to any of the package substrates 220 and 320 described above.

In an embodiment, the package substrate 420 may comprise a plurality of dielectric buildup layers 411 with conductive routing (e.g., conductive routing 412A and 412B). In an embodiment, a planar inductor 425 is embedded in the buildup layers 411. The planar inductor 425 electrically couples the first die 430A to the second die 430B. In an embodiment, the planar inductor 425 comprises a trace 443 with a first end 441 and a second end 442. A magnetic material 444 may surround all of the trace 443 or a portion of the trace 443 between the first end 441 and the second end 442. In an embodiment, the magnetic material 444 may contact the conductive layer 412A below the trace 443 and the conductive layer 412E above the trace 443.

In an embodiment, the first end 441 is positioned below the first die 430A, and the second end 442 is positioned below the second die 430B. The first end 441 is connected to a pad 447 by a first via 445, and the second end 442 is connected to a pad 448 by a second via 446. Solder bumps 431A and 431E (or any other suitable interconnect architecture) may electrically couple the pads 447 and 448 to the first die 430A and the second die 430B.

In an embodiment, the first die 430A may comprise VR circuitry 451. For example, the VR circuitry 451 may comprise fully integrated voltage regulator (FIVR) circuitry. The VR circuitry 451 may be electrically coupled to a first end 441 of the planar inductor 425 through a bump 431A, pad 447, and via 445. In an embodiment, the second die 430B may comprise a load 452 that receives an output from the planar inductor 425. The load 452 may be coupled to the second end 442 of the planar inductor 425 through a bump 431B, pad 448, and via 446.

In an embodiment, the first die 430A is manufactured at a first process node, and the second die 430B is manufactured at a second process node. In a particular embodiment, the second process node is more advanced than the first process node. For example, the second process node may be the 14 nm process node, the 10 nm process node, the 7 nm process node, or any other advanced process node. In an embodiment, the first die 430A may be an I/O die, and the second die 430B may be a processor core die. Particularly, it is noted that such a configuration allows for the VR circuitry to be disaggregated from the more advanced node second die 430B. As such, the cost of the second die 430B may be reduced. Additionally, since the planar inductor 425 does not require a core layer, the cost of the package substrate 420 can also be reduced.

Figure 4B:
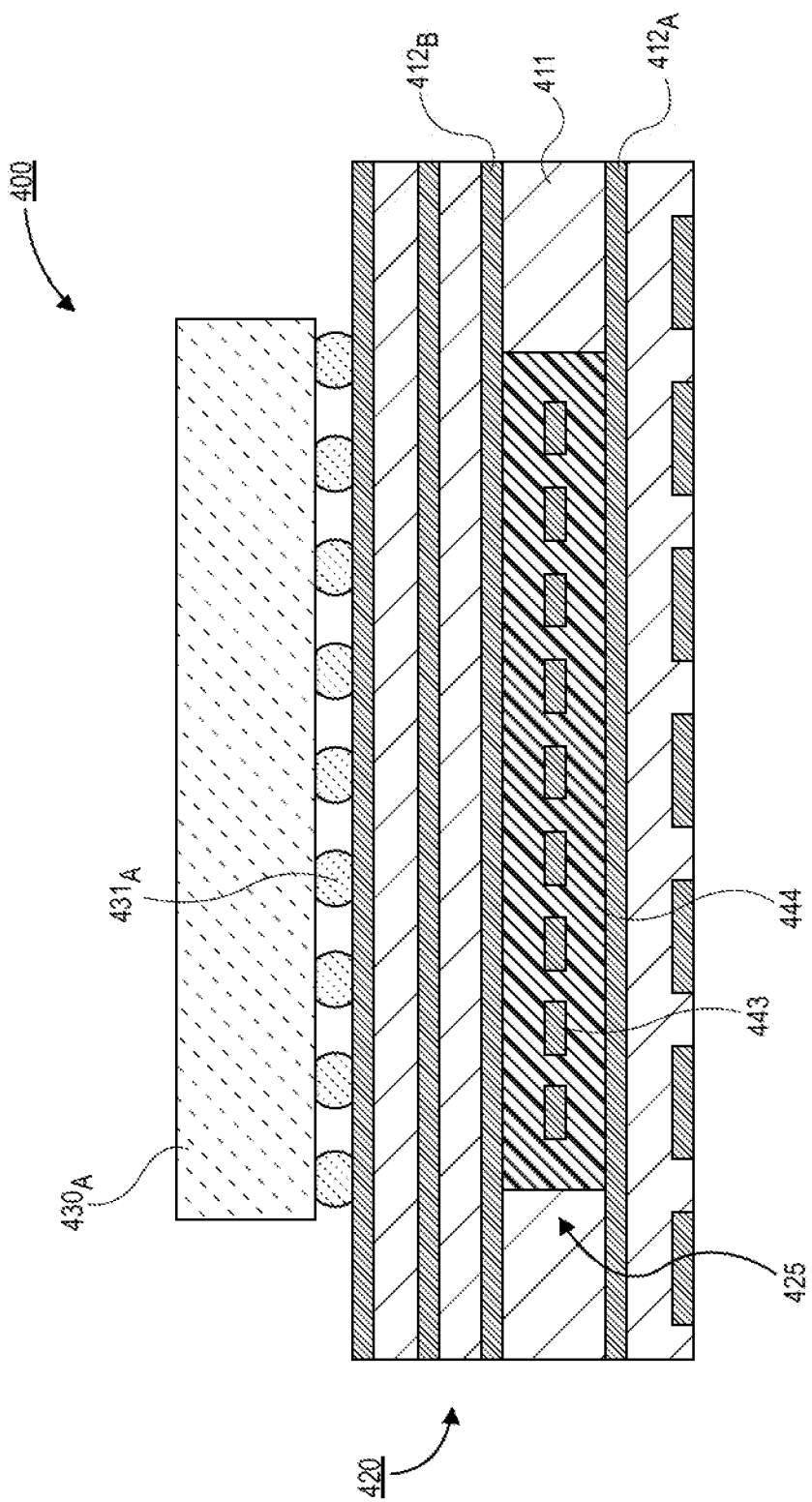
FIG. 4B is a cross-sectional illustration of the electronic system in FIG. 4A that illustrates a plurality of embedded planar inductors surrounded by a single magnetic material layer, in accordance with an embodiment.

Referring now to FIG. 4B, a cross-sectional illustration of the electronic system 400 in FIG. 4A along line 4-4 is shown, in accordance with an embodiment. As shown, a plurality of traces 443 are embedded within a single magnetic material 444. However, it is to be appreciated that discrete magnetic material around each of the traces 443 may also be used (e.g., similar to the embodiment illustrated in FIG. 2C). Furthermore, while nine traces 443 are shown, any number of traces 443 may be embedded within a single magnetic material 444.

Figure 5:
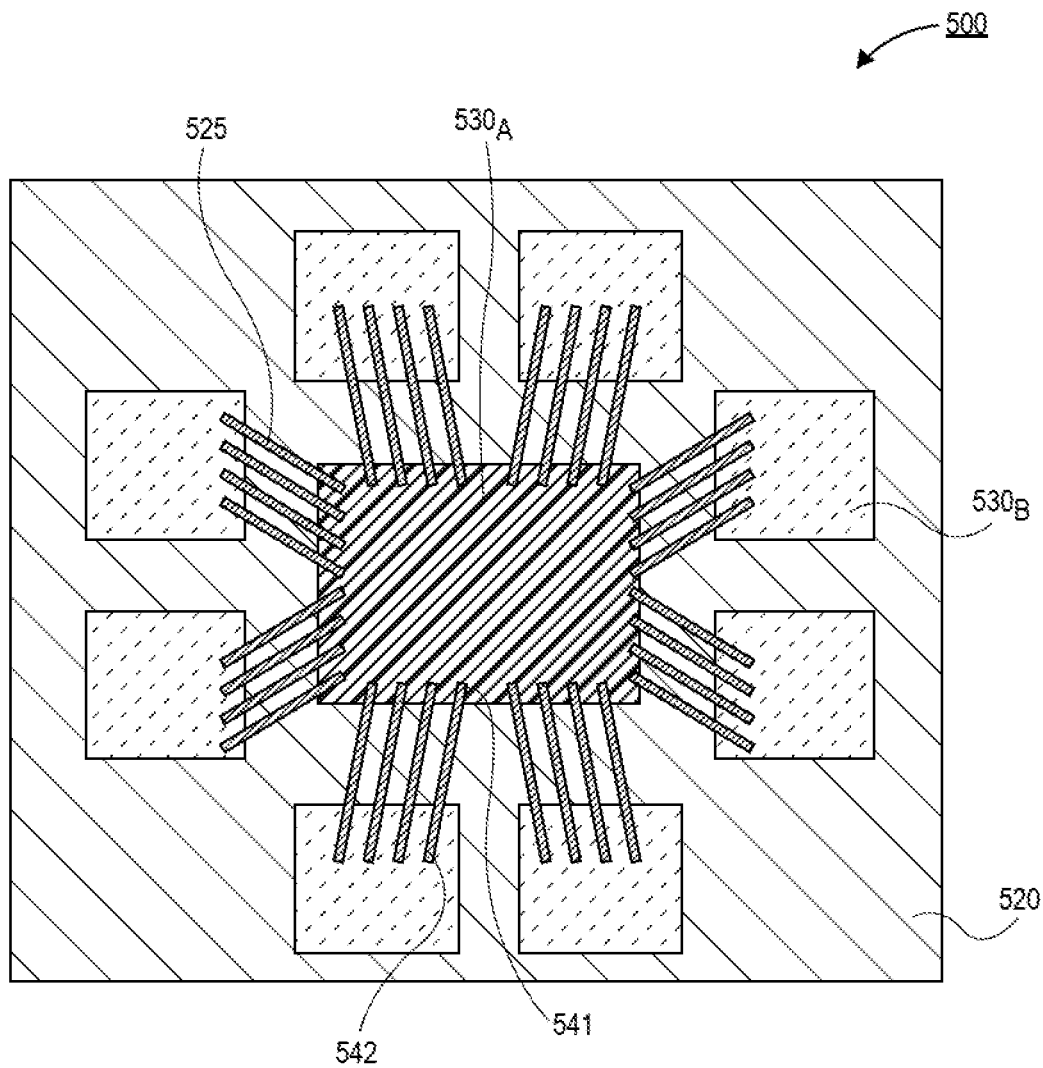
FIG. 5 is a plan view illustration of an electronic system with a central first die and a plurality of second dies surrounding the first die, where a plurality of planar inductors electrically couple the first die to individual ones of the plurality of second dies, in accordance with an embodiment.

Referring now to FIG. 5, a plan view illustration of an electronic system 500 is shown, in accordance with an embodiment. In an embodiment, the electronic system 500 comprises a package substrate 520, a first die 530A and a plurality of second dies 530E that surround a perimeter of the first die 530A. In an embodiment, the package substrate 520 may be substantially similar to any of the package substrates described in greater detail above. For example, the package substrate 520 may be a coreless package substrate in some embodiments.

In an embodiment, the first die 530A may be an I/O die, and the second dies 530E may be processor cores. While eight second dies 530E are shown, it is to be appreciated that any number of second dies 530E may be provided. Additionally, while shown as being around a perimeter of the first die 530A it is to be appreciated that the second dies 530E may be located at any location across the package substrate 520.

In an embodiment, the first die 530A may be electrically coupled to individual ones of the plurality of second dies 530E by planar inductors 525. The planar inductors 525 may be embedded in the package substrate 520. The planar inductors 525 may be substantially similar to any of the planar inductors described above. For example, the planar inductors 525 may comprise a lateral trace embedded in the package substrate 520 and surrounded by a magnetic material along at least a part of the lateral length of the trace.

In an embodiment, the planar inductors 525 may have a first end 541 that is below a footprint of the first die 530A and a second end 542 that is below a footprint of an individual one the plurality of second dies 530B. In a particular embodiment, the first end 541 of the planar inductor 525 may be below VR circuitry (not shown) that is integrated into the first die 530A, and the second end 542 may be below a load (not shown) in the second die 530B. As shown, a plurality of planar inductors 525 are provided between the first die 530A and each of the second dies 530B. While four planar inductors 525 are provided to each second die 530B, it is to be appreciated that any number of planar inductors 525 may be provided to each second die 530B. Additionally, the planar inductors 525 are illustrated as straight lines. However, it is to be appreciated that the planar inductors 525 may have turns or the like in order to provide the necessary routing to electrically couple the first die 530A to the second dies 530B.

Figure 6:
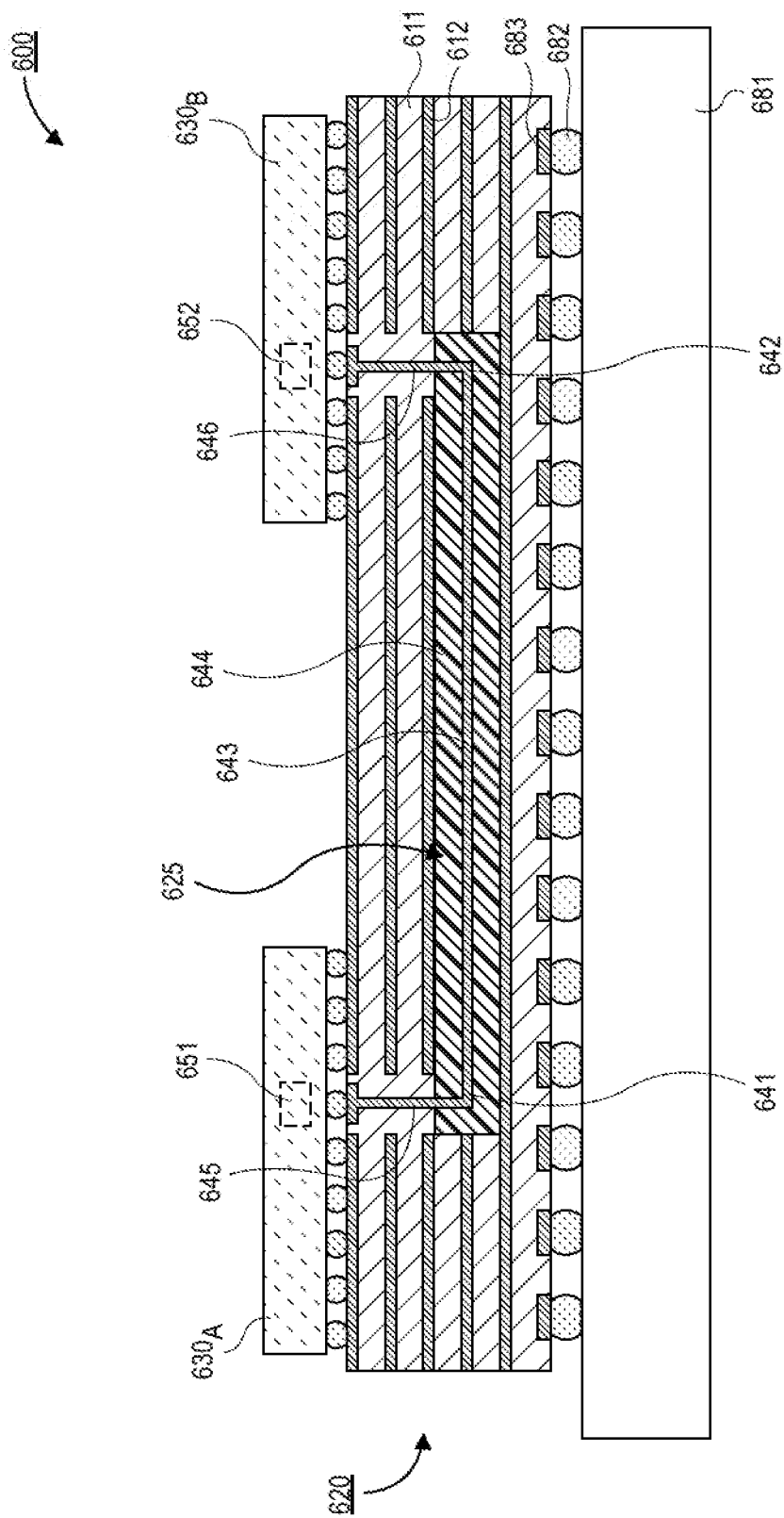
FIG. 6 is a cross-sectional illustration of an electronic system with a board, a package substrate, a first die, a second die, and an embedded planar inductor between the first die and the second die, in accordance with an embodiment.

Referring now to FIG. 6, a cross-sectional illustration of an electronic system 600 is shown, in accordance with an embodiment. In an embodiment, the electronic system 600 comprises a board 681 and a package substrate 620 attached to the board 681 by interconnects 682 and pads 683. In an embodiment, the interconnects 682 are shown as solder balls. However, it is to be appreciated that any interconnect architecture, such as sockets or the like, may be used to connect the package substrate 620 to the board 681.

In an embodiment, a first die 630A and a second die 630B are electrically coupled to the package substrate 620. In an embodiment, the first die 630A is manufactured at a first process node, and the second die 630B is manufactured at a second, more advanced, process node. In a particular embodiment, the first die 630A is an I/O die, and the second die 630B is a processor core. In an embodiment, the first die 630A comprises VR circuitry 651, and the second die 630B comprises a load 652. As such, VR disaggregation is provided. This reduces the cost and complexity of the second die 630B.

In an embodiment, a planar inductor 625 electrically couples the VR circuitry 651 to the load 652. The planar inductor 625 comprises a trace 643 that is embedded in a magnetic material 644. The magnetic material 644 may extend along a length (or partially along the length) of the trace 643 between a first end 641 and a second end 642 of the inductor. In an embodiment, the first end 641 is electrically coupled to the first die 630A by a first via 645, and the second end 642 is electrically coupled to the second die 630B by a second via 646. In an embodiment, the trace 643 may be a trace in a conductive layer 612 that is embedded in one or more dielectric layers 611 of the package substrate 620.

Figure 7:
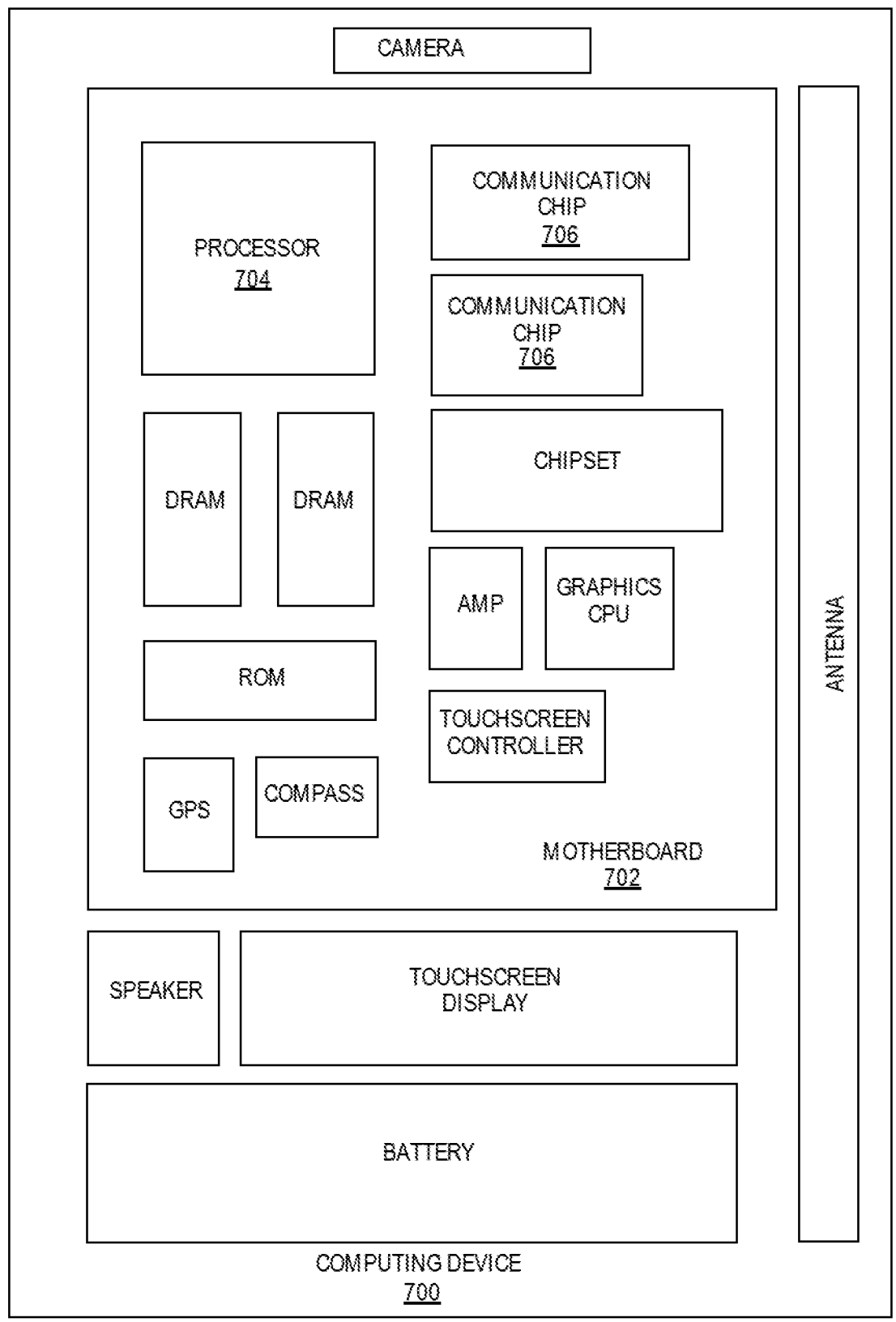
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations, the integrated circuit die of the processor may be coupled to a coreless package substrate that comprises a planar inductor formed from a lateral trace that is surrounded by a magnetic material, where the integrated circuit die is over a first end of the planar inductor, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be coupled to a coreless package substrate that comprises a planar inductor formed from a lateral trace that is surrounded by a magnetic material, where the integrated circuit die is over a first end of the planar inductor, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate, wherein the package substrate comprises a plurality of dielectric layers; and an inductor embedded in the package substrate, wherein the inductor comprises: a trace with a first end and a second end; a magnetic material surrounding the trace between the first end and the second end; a first via connected to the first end; and a second via connected to the second end.

Example 2: the electronic package of Example 1, wherein the magnetic material extends along an entire length of the trace between the first end and the second end.

Example 3: the electronic package of Example 1 or Example 2, wherein the magnetic material covers only a portion of the trace between the first end and the second end.

Example 4: the electronic package of Examples 1-3, wherein the trace is entirely within a single one dielectric layer of the plurality of dielectric layers.

Example 5: the electronic package of Examples 1-4, further comprising: a second inductor embedded in the package substrate, wherein the second inductor comprises: a second trace, wherein the second trace is adjacent to the trace.

Example 6: the electronic package of Example 5, wherein the second trace is surrounded by a second magnetic material.

Example 7: the electronic package of Example 5, wherein the second trace is surrounded by the magnetic material.

Example 8: the electronic package of Examples 1-7, further comprising: a first conductive layer above the trace; and a second conductive layer below the trace, and wherein the magnetic material contacts the first conductive layer and the second conductive layer.

Example 9: the electronic package of Examples 1-8, wherein the magnetic material extends past the first via and past the second via.

Example 10: the electronic package of Examples 1-9, further comprising: a first die electrically coupled to the first via; and a second die electrically coupled to the second via.

Example 11: the electronic package of Example 10, wherein the first die is manufactured at a first process node, wherein the second die is manufactured at a second process node, and wherein the second process node is more advanced than the first process node.

Example 12: the electronic package of Example 11, wherein the first die comprises voltage regulation (VR) circuitry, and wherein the second die is a processor.

Example 13: an electronic system, comprising: a package substrate; a first die coupled to the package substrate; and a plurality of second dies coupled to the package substrate, wherein the plurality of second dies surround a perimeter of the first die; and wherein the first die is electrically coupled to individual ones of the plurality of second dies by separate planar inductors embedded in the package substrate.

Example 14: the electronic system of Example 13, wherein individual ones of the planar inductors comprise: a trace embedded in the package substrate, wherein the trace has a first end under a footprint of the first die and a second end under a footprint of an individual one of the plurality of second dies; and a magnetic material surrounding the trace between the first end and the second end.

Example 15: the electronic system of Example 14, wherein the magnetic material extends from the first end to the second end.

Example 16: the electronic system of Example 14, wherein the magnetic material surrounds only a portion of the trace between the first end and the second end.

Example 17: the electronic system of Examples 14-16, wherein individual ones of the planar inductors further comprise: a first via at the first end of the trace, wherein the first via is electrically coupled to the first die; and a second via at the second end of the trace, wherein the second via is electrically coupled to the second die.

Example 18: the electronic system of Examples 13-17, wherein a plurality of planar inductors embedded in the package substrate electrically couple the first die to an individual one of the plurality of second dies.

Example 19: the electronic system of Example 18, wherein the plurality of planar inductors comprises: a plurality of traces; and a magnetic material surrounding the plurality of traces.

Example 20: the electronic system of Examples 13-19, wherein the package substrate comprises a plurality of dielectric layers, and wherein individual ones of the planar inductors are embedded within a single dielectric layer of the plurality of dielectric layers.

Example 21: the electronic system of Example 20, further comprising: a first conductive layer above individual ones of the planar inductors; and a second conductive layer below the individual ones of the planar inductors.

Example 22: the electronic system of Example 21, wherein the individual ones of the planar inductors comprises a magnetic layer surrounding a trace, and wherein the magnetic layer contacts the first conductive layer and the second conductive layer.

Example 23: an electronic system, comprising: a board; a package substrate coupled to the board; a first die coupled to the package substrate; a second die coupled to the package substrate; and a planar inductor embedded in the package substrate, wherein a first end of the planar inductor is below the first die, and wherein a second end of the planar inductor is below the second die.

Example 24: the electronic system of Example 23, wherein the planar inductor comprises: a trace from the first end to the second end; and a magnetic material surrounding the trace between the first end and the second end.

Example 25: the electronic system of Example 24, wherein the magnetic material extends an entire distance between the first end and the second end.

What is claimed is:
1. An electronic package, comprising:
a package substrate, wherein the package substrate comprises a plurality of dielectric layers; and an inductor embedded in the package substrate, wherein the inductor comprises:
a trace with a first end and a second end;
a magnetic material surrounding the trace between the first end and the second end;
a first via connected to the first end; and
a second via connected to the second end, wherein the magnetic material extends laterally beyond the first via along a direction from the second via to the first via, and the magnetic material extends laterally beyond the second via along a direction from the first via to the second via, wherein the first via is above and vertically overlapping with the magnetic material, the first via having a bottom surface in contact with the magnetic material, and wherein the second via is above and vertically overlapping with the magnetic material, the first via having a bottom surface in contact with the magnetic material.

2. The electronic package of claim 1, wherein the magnetic material extends along an entire length of the trace between the first end and the second end.

3. The electronic package of claim 1, wherein the magnetic material covers only a portion of the trace between the first end and the second end.

4. The electronic package of claim 1, wherein the trace is entirely within a single one dielectric layer of the plurality of dielectric layers.

5. The electronic package of claim 1, further comprising:
a second inductor embedded in the package substrate, wherein the second inductor comprises:
a second trace, wherein the second trace is adjacent to the trace.

6. The electronic package of claim 5, wherein the second trace is surrounded by a second magnetic material.

7. The electronic package of claim 5, wherein the second trace is surrounded by the magnetic material.

8. The electronic package of claim 1, further comprising:
a first conductive layer above the trace; and
a second conductive layer below the trace, and wherein the magnetic material contacts the first conductive layer and the second conductive layer.

9. The electronic package of claim 1, further comprising:
a first die electrically coupled to the first via; and
a second die electrically coupled to the second via.

10. The electronic package of claim 9, wherein the first die is manufactured at a first process node, wherein the second die is manufactured at a second process node, and wherein the second process node is more advanced than the first process node.

11. The electronic package of claim 10, wherein the first die comprises voltage regulation (VR) circuitry, and wherein the second die is a processor.

* * * * *